Figure 1A:
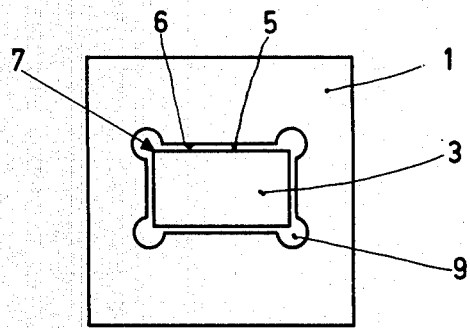

United States Patent [19]

Horstmann

[11] 4,359,157
[45] Nov. 16, 1982

[54] PACKING FOR A STACK OF RECTANGULAR, PLATE-SHAPED PARTS

[75] Inventor: Hans W. Horstmann, Heide Holst, Fed. Rep. of Germany

[73] Assignee: U.S. Philips Corporation, New York, N.Y.

[21] Appl. No.: 169,332

[22] Filed: Jul. 16, 1980

[30] Foreign Application Priority Data

Jul. 21, 1979 [DE] Fed. Rep. of Germany ....... 2929716

[51] Int. Cl.³ .................... B65D 83/00; B65D 85/62; B65G 59/00; B65G 1/08
[52] U.S. Cl. .................................. 206/328; 206/499; 221/312 R
[58] Field of Search ............. 206/328, 331, 499, 563, 206/445, 815, 334; 221/312 R

[56] References Cited

U.S. PATENT DOCUMENTS

| | | | |
|---|---|---|---|
| 3,407,079 | 10/1968 | Griffith et al. | 206/499 |
| 3,454,154 | 7/1969 | Peters et al. | 206/331 |
| 4,037,267 | 7/1977 | Kisor | 206/331 |
| 4,043,485 | 8/1977 | Tippets | 221/312 R |

Primary Examiner—William T. Dixson, Jr.
Attorney, Agent, or Firm—Thomas A. Briody; William J. Streeter; Rolf E. Schneider

[57] ABSTRACT

A package for a stack of rectangular, plate-shaped parts, such as electronic components, comprises a tubular container having a rectangular internal cross section corresponding to the parts to be packed. The interior of the tubular container has a recess at each corner so that the parts cannot jam or block during passage through the container.

2 Claims, 6 Drawing Figures

PACKING FOR A STACK OF RECTANGULAR, PLATE-SHAPED PARTS

This invention relates to a packing for a stack of rectangular, plate-shaped parts, such as electronic components, comprising a tube whose interior space has a mainly rectangular cross-section in accordance with the parts to be accommodated, it being possible to close said tube at both ends with insertable caps.

Rectangular, plate-shaped parts are to be understood to mean herein parts whose adjacent sides enclose a right angle with respect to each other and are equally long or not.

It is known to construct tubular packings on containers for a large number of small parts which are to be further used during a process so that they can be placed, either as a separate magazine or as an array of magazines which consists of a large number of separate magazines, in a machine which performs this process, the parts stacked in the packing being successively and separately removed from the packing.

Such stacking of rectangular parts creates a problem in that such parts tend to tilt and subsequently jam during their travel through the packing, because the interior space of the packing in which the parts are situated must provide a given clearance for easy insertion and subsequent easy sliding of the parts in the packing.

The present invention has for its object to provide a packing or package for a stack of rectangular plate-shaped parts which can also be arranged as a magazine in further processing machines and whose interior space for accommodating the parts is constructed so that on the one hand the parts can be readily introduced into the packing in which they are accurately stored and guided, whilst on the other hand they can move therein without tilting, jamming or clogging.

This object in accordance with the invention is achieved in that the interior space is provided with cavities or recesses at the corners.

The invention is based on the recognition of the fact that the tilting, jamming and clogging during the travel of rectangular parts through an interior space having a rectangular cross-section occurs first of all at the corners of the interior space of the packing.

The cavities or recesses preferably have a circular shape.

In order to enable the packing to be used also as a magazine in a further processing machine, for which purpose these magazines should be quickly arranged in a predetermined position, one outer surface face of the tube is desirably bevelled. The bevelled face thus obtained on the outside of the tube serves as a reference face for the positioning of the packing and the parts accommodated therein.

Furthermore, on at least one outer face of the tube there may be provided a strip code and a mark which can be read forwards and backwards by the machine and which make the top and the bottom of the parts accommodated in the packing recognizable from the outside.

The advantages achieved by means of the invention consist in that not only a packing for a large number of rectangular parts is obtained, but there is also provided a magazine for the further processing of these parts in a machine which enables a smooth process also at a high production speed and the necessary fast transport of the parts in the magazine, because the tilting, jamming and/or clogging of parts in the interior of the magazine is avoided. The positioning of these magazines in a machine by way of the bevelled reference face on the outside of the tube and the strip code and the marking on at least one outer face of the packing which can be read forwards and backwards by the machine are further advantages, because positioning errors of the magazines in the machine and hence of the parts on elements on which they are to be further processed can be precluded with certainty.

In order to enable the positioning of a number of packings, each of which contains a stack of parts of a different type or different dimensions, in any desired pattern with respect to each other, the individual tubes have the same outside dimensions and preferably a square outer cross-section, whilst the dimensions of their interior spaces may differ.

The invention will now be described in detail with reference to the accompanying drawings, in which.

Figure 1B:
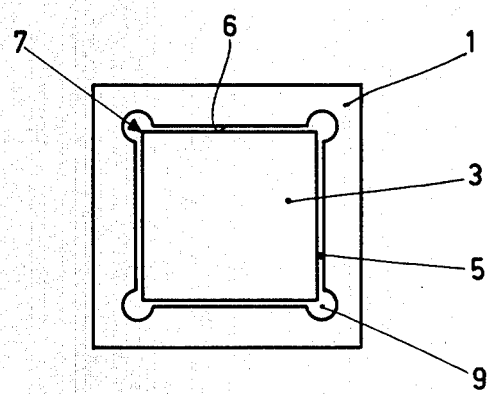
Figure 1C:
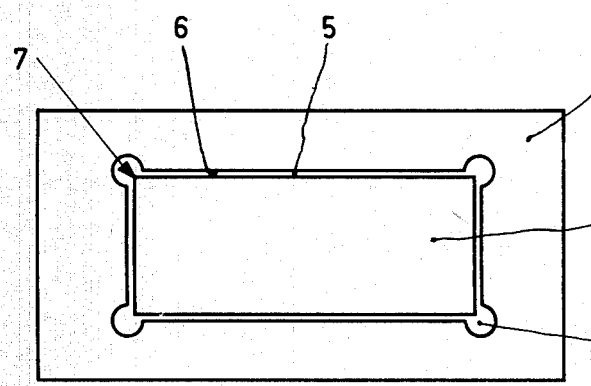
Figure 2:
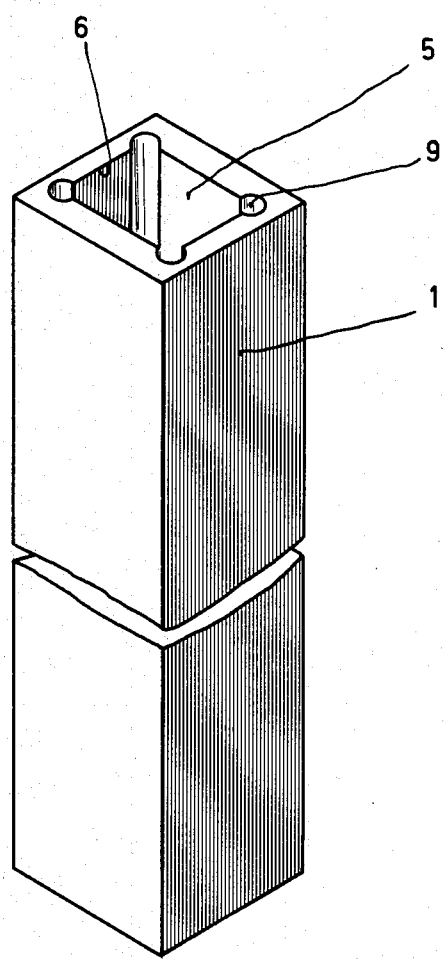
Figure 3:
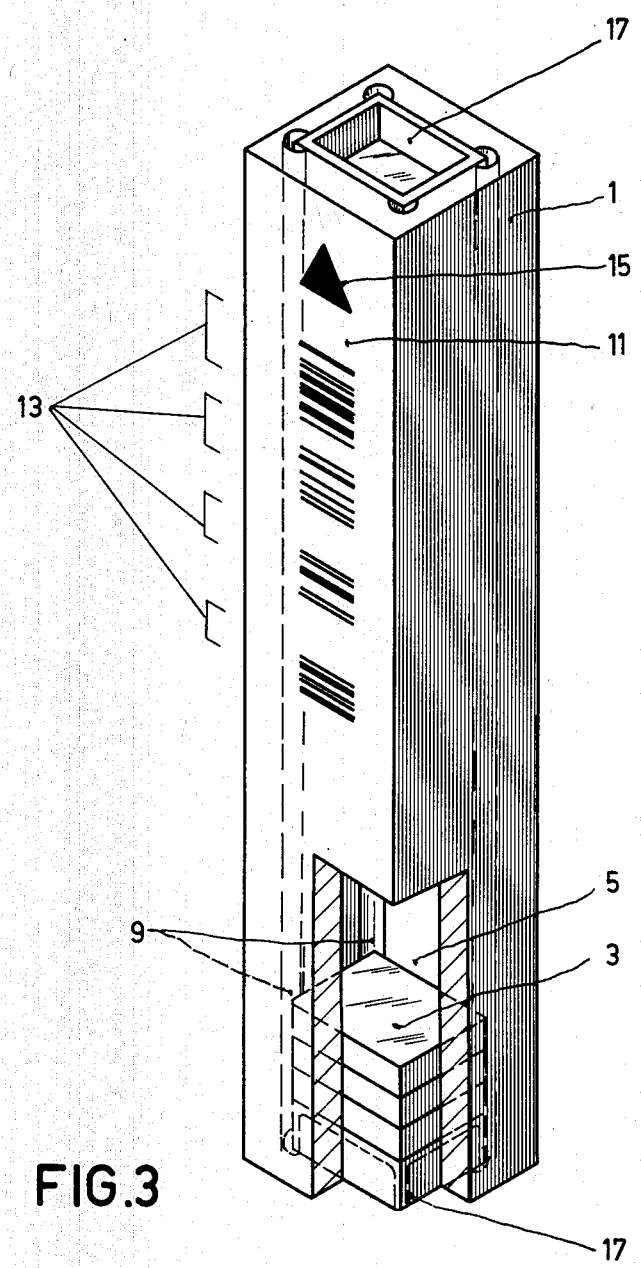
Figure 4:
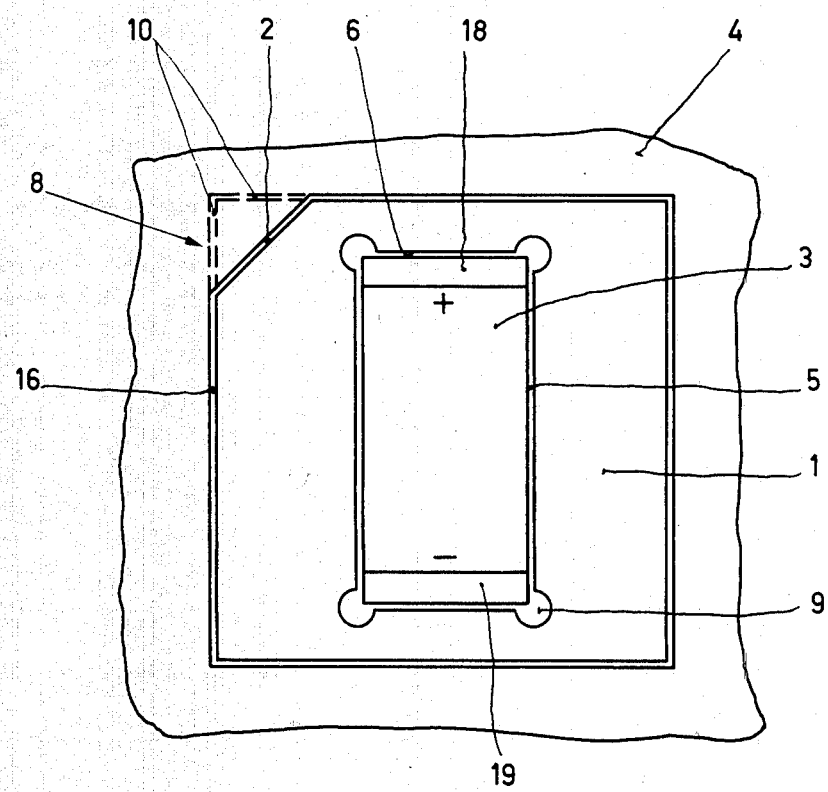

FIGS. 1a to 1c are plan views of packings having interior spaces of different shapes, FIG. 2 is a perspective view of a packing in accordance with the invention, FIG. 3 is a perspective, partly cross-sectional view of a packing in accordance with the invention, and FIG. 4 is a plan view of a packing having a bevelled edge.

Each of FIGS. 1a, 1b and 1c shows a tubular packing or container 1, comprising an interior space 5 in which plate-shaped parts 3 are accommodated. This interior space 5 of the tubular packing 1 is bounded by inner planar walls 6 and is shaped so that its free cross-section is slightly larger than the outer circumference of the plate-shaped parts 3 to be packed therein, thus ensuring that these parts can readily slide in the packing or package.

In order to prevent the parts 3 from jamming at their corners 7 during the sliding in the interior space 5, cavities or recesses 9 are provided at the areas where inner walls 6 of the interior space 5 adjoin, notably with a right angle, said cavities imparting a given freedom of movement at the corners 7 to the stacked parts 3. In the embodiment shown, the cavities or recesses have a circular shape. The parts 3 are thus guided only by the inner walls 6 in the interior space 5 of the packing 1.

FIG. 2 is a perspective view of the packing 1, however, without plate-shaped parts in the interior space 5.

FIG. 3 shows the packing 1 with a strip code 13 which is provided on an outer face 11 and which can be read forwards and backwards by a processing machine, and with a mark 15. The machine-readable strip code 13 provides information concerning the contents of the packing, such as type indications, number of parts etc.; the mark 15 indicates the direction in which the parts 3 should be removed from the packing 1 or the stacking of the parts 3 in the packing 1 as regards their top and bottom. The open ends of the packing are closed by way of insertable caps 17.

200 plate-shaped electronic components 3, dimensioned $3.2 \times 1.6 \times 1$ mm, were stacked in the interior space 5 of a packing as shown in FIG. 3; the transverse dimensions of the space 5 amounted to $3.3 \times 1.7$ mm; the dimensions of the cross-section of the packing 1 amounted to $4.5 \times 4.5$ mm.

The packing should be made of a comparatively rigid material in order to ensure that the parts present therein are suitably guided when the packing is used as a magazine. Thermoplastic synthetic materials such as polystyrene or polyamide are particularly suitable for this purpose.

FIG. 4 is a plan view of a packing 1 having a square outer cross-section, a bevel 2 being provided at one corner of the packing. The bevel 2 serves, if necessary, to ensure a given position of the packing when the packing is arranged in a processing machine, for example, in a holder containing several packings. This may be of importance, for example, when the packed parts 3 are electrically polarized parts, for example, diodes and transistors comprising contact faces 18 and 19. It should then be ensured that the packing containing the polarized parts is arranged in the processing machine so that the polarized parts are mounted with the correct polarity, for example, on a printed circuit. This is achieved by bevelling one corner 2 at an angle of, for example, 45°. In the described embodiment, the length of the legs 10 of the triangle produced by the bevel 2 amounted to 1 mm and the overall length of one outer side of the packing amounted to 4.5 mm.

When several bevelled packings 1 are to be combined in a holder 4, the holder 4 should be provided with a cavity 16 for each separate bevelled packing 1, said cavity having one filled corner 8 mating with the bevel 2 of the packing 1. It is thus ensured that pole reversal due to incorrect positioning of the packings 1 used as a magazine is precluded. Preferably, all packings have the same external dimensions regardless of any different internal dimensions.

What is claimed is:

1. A package for a stack of rectangular, plate-shaped parts such as electronic components to be subsequently utilized, which comprises a longitudinal tubular container having a rectangular internal cross section corresponding to the parts to be accommodated, each internal wall of said container being planar, said parts being movable through said container and also being separately and successively removable from said container when they are utilized, and a longitudinally extending recess at each internal corner of said tubular container to facilitate the movement of said parts through the container.

2. A package according to claim 1, in which the external cross section of the tubular container is square.

* * * * *